United States Patent [19]
Kumar et al.

[11] Patent Number: 5,561,397
[45] Date of Patent: Oct. 1, 1996

[54] SOLID STATE AMPLIFIER FOR MICROWAVE TRANSMITTER

[75] Inventors: Mahesh Kumar, Hauppauge; Michael E. Knox, Bayside; Russel Youmans, Merrick, all of N.Y.

[73] Assignee: Unisys Corporation, Blue Bell, Pa.

[21] Appl. No.: 440,582

[22] Filed: May 15, 1995

[51] Int. Cl.$^6$ .............................. H03F 3/68; H03F 3/60
[52] U.S. Cl. ........................... 330/295; 330/297; 330/286
[58] Field of Search .......................... 330/124 D, 124 R, 330/127, 286, 295, 297

[56] References Cited

U.S. PATENT DOCUMENTS

| | | | |
|---|---|---|---|
| 4,926,136 | 5/1990 | Olver | 330/295 X |
| 5,256,987 | 10/1993 | Kibayashi et al. | 330/295 |

OTHER PUBLICATIONS

Rivera, D. J. "An S-Band Solid State Transmitter For Aiport Survellance Radars", IEEE Nat'l Radar Conference, 1993.
Skolnik, M. I. *Radar Handbook*, 2nd Edition, Chapter 5 McGraw-Hill, New York, 1990.

*Primary Examiner*—Steven Mottola
*Attorney, Agent, or Firm*—Seymour Levine; Mark T. Starr

[57] ABSTRACT

A solid state amplifier for a microwave transmitter includes a power divider wherein a signal to be amplified is divided into signals of equal signal levels. The equal level signals are respectively coupled to a plurality of amplifiers wherefrom the amplified signals are coupled to a combiner wherein the amplified signals are added and signal sum provided at an output terminal of the combiner. Each of the amplifiers may be comprised of a first stage amplifier, the output signal of which is coupled to a multiplicity of component amplifiers which, in tem, are coupled to a the output terminal of the first stage amplifier via a second power divider wherefrom signals of equal level are provided to the component amplifiers. Bias voltages are provided to the amplifiers via a modularized power supply having some modules with redundant converters.

13 Claims, 8 Drawing Sheets

SOLID STATE AMPLIFIER FOR MICROWAVE TRANSMITTER

BACKGROUND OF THE INVENTION

1. Field of the Invention

The invention pertains to the field of microwave transmitters, and are particularly to high power, solid state, microwave transmitters

2. Description of the Prior Art

Transmitters provide the high power carrier signals in radar and communication systems. These transmitters are modulated in communication systems by signals representative of the information to be transmitted. In pulsed radar systems the transmitters are amplitude modulated to provide the periodic pulse train required for target detection. Some radar systems require continuous wave (CW) transmission for target illumination and tracking. In these systems the transmitter is not amplitude modulated and a CW signal is radiated from the antenna. Each modern radar and communication system requires a transmitter that is stable in both frequency and amplitude and is highly reliable, having long times between failures.

The reliability and stability requirements imposed on modern radar systems precludes the use of vacuum tubes, such as klystron and traveling wave tube (TWT) amplifiers, to amplify the output signal of a low power oscillator to provide the transmitter power. Additionally, these tubes are large devices with large internal structures. The size and geometry of the tubes and their internal structures renders them microphonic and shock sensitive, which increase the noise and spurious signals close to the carrier signal. The noise and spurious signals, which are in the receiver pass band, create serious performance limitations in doppler radar systems. Targets with Doppler shifted frequencies in the receiver pass band will be obscured by the noise and spurious signals and will not be detected.

Many of the disadvantages of the amplifiers may be overcome by the use of solid state amplifiers. These devices have noise figures below 10 dB, compared to noise figures in the order of 30 to 40 dB for tube amplifiers, and are far less susceptible to noise generation caused by vibration and shock. It should be noted, however, that power supply noise and ripple tend to modulate the output of a solid state amplifier. Consequently, the noise and ripple at the output of the solid state amplifier power supplies must be held to a minimum.

SUMMARY OF THE INVENTION

In accordance with the principles of the present invention, a solid state microwave amplifier is coupled to receive a signal from a low power oscillator at the input terminal of a 1:N power divider. The N output terminals of the power divider are respectively coupled to N identical amplifiers, in a first bank of amplifiers. The output terminals of the N amplifiers in the first bank of amplifiers are respectively coupled to N identical amplifiers in a second bank of amplifiers.

Each amplifier in the second bank of amplifiers has an input terminal coupled to a 1:M power divider, the amplifiers. The M phase shifters are varied to establish equal phase shifts between the input terminal of the 1:N power divider and the output terminal of the each of the M component amplifiers in each amplifier in the second bank of amplifiers. The output terminals of the M amplifiers are coupled to a M:1 power combiner, the output terminal of which is the output terminal of that amplifier in the second bank of amplifiers. The N output terminals of the second bank of amplifiers are coupled to a N:1 power combiner, the output terminal of which is the output terminal of the microwave amplifier.

The 1:N and 1:M power dividers each comprise a plurality of amplifier input directional couplers of varying coupling values, serially coupled and arranged to respectively couple equal power from the directional couplers to the N and M amplifiers in the first and second banks of amplifiers, respectively. Similarly, the N and M output terminals of the first and second banks of amplifiers are respectively coupled to output directional couplers of the same varying coupling values, serially coupled and arranged in reverse order to the arrangement of the input directional couplers. Thus, the combination of divider-combiner coupling is equal for the amplifiers and each is given equal weight in the output sum.

When assembled, the microwave amplifier is arranged in a cabinet comprising N drawers, each drawer containing corresponding amplifiers from the first and second banks of amplifiers. This modular arrangement permits the replacement of a failed amplifier without interrupting energy transmission. Additionally, the modular arrangement is power scalable, permitting the addition or removal of amplifier draws to increase or decrease the output power level.

Each of the amplifiers in the second bank may be comprised of a multiplicity P of low power amplifiers which may be coupled between an input waveguide, coupled to an output terminal of the 1:M power divider, and an output waveguide, coupled to an input terminal of the M:1 combiner. The coupling to the input waveguide is via crossguide directional couplers of varying coupling values such that the signal coupled to input waveguide from the 1:M power divider is divided into P equal signals. Coupling of the P low power amplifiers to the output waveguide is similar to coupling to the input waveguide with the directional couplers of varying coupling values being in mirror image order to that of the input waveguide coupling. Each of the low power amplifiers my comprise monolithic microwave integrated circuits (MMIC) coupled to the input and output waveguides via microstrip transmission lines and waveguide-to-microstrip transitions.

The MMIC amplifier circuits include FET type amplifiers, the reliability of which is enhanced with the utilization of a distributed power supply for the positive drain voltage and a separate redundant power supply for the negative gate bias.

DESCRIPTION OF THE PREFERRED EMBODIMENTS

Figure 1:
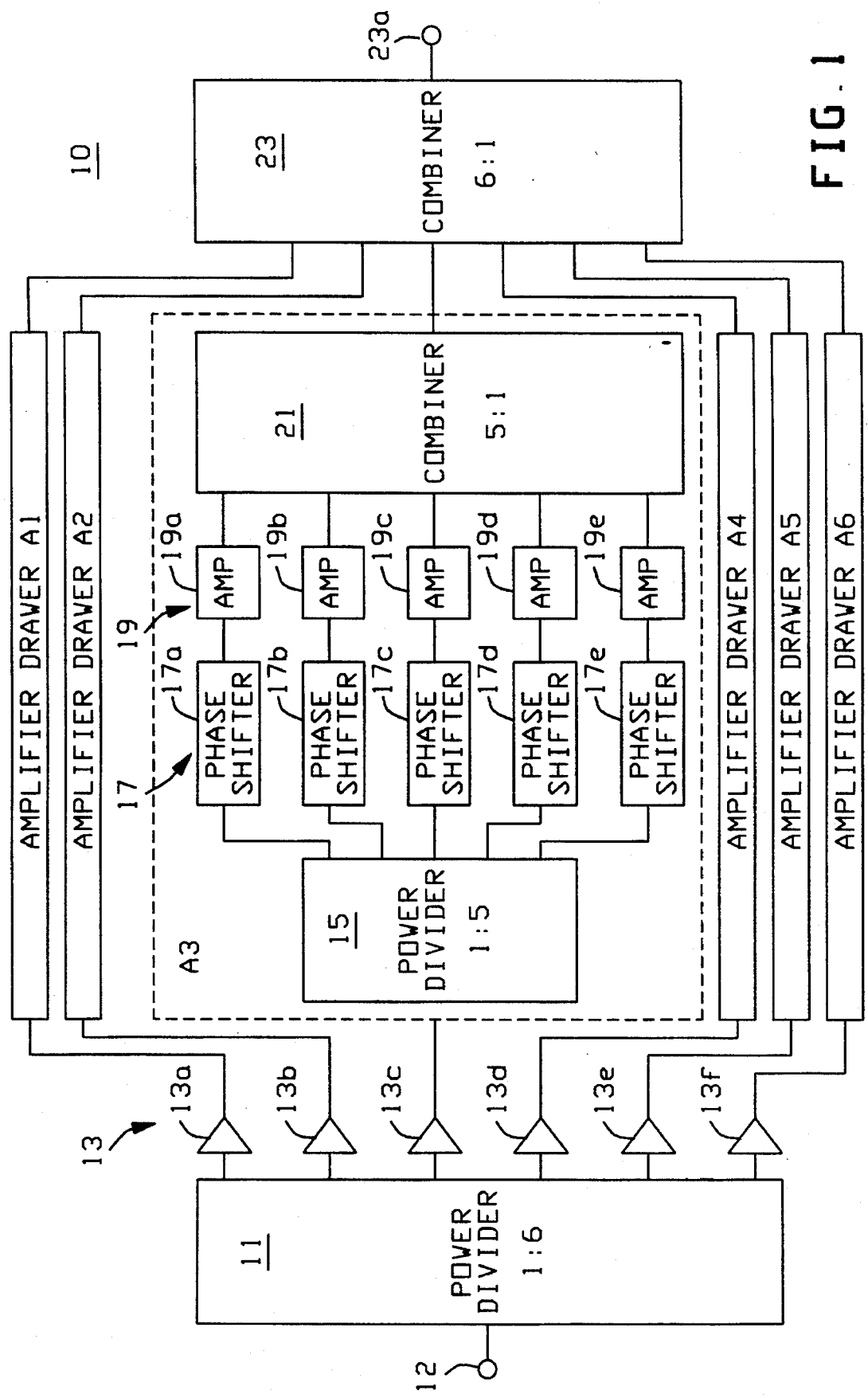
FIG. 1 is a block diagram of a high power solid state microwave amplifier.

Referring to FIG. 1, a solid state high power microwave amplifier 10 may include a 1:6 power divider 11 which processes a signal coupled to an input terminal 12 to provide six signals of equal amplitude to a first bank of six similarly constructed amplifiers 13a–13f, respectively. The amplified signals at the output terminals of the amplifiers 13a–13f, which are of equal amplitude, are respectively coupled to a second bank of six similarly constructed amplifiers A1–A6, of which the construction representative of amplifier A3 is typical.

A signal from an amplifier in the first bank of amplifiers 13 may be coupled to a 1:5 power divider 15 in an amplifier of the second bank of amplifiers. Signals at the output terminals of the power divider 15, which are of equal amplitude, are respectively coupled via five variable phase shifters 17a–17e, to five component amplifiers 19a–19e wherefrom the amplified signals are coupled to a 5:1 power combiner 21. The signal at the output terminal of the combiner 21, which is the signal output of an amplifier in the second bank of amplifiers, is coupled to a 6:1 power combiner 23. Power combiner 23 combines output signals of all six amplifiers in the second bank of amplifiers and provides the amplified signal of the amplifier 10 at an output terminal 23a.

Maximum power obtainable from the power combiner 21 is provided at its output terminal when the signals coupled to its input terminals are of equal phase. These equal phase signals are provided by adjusting phase shifters 17a–17e in a manner which establishes signals of equal phase at the output terminals of the amplifiers 19a–19e. Since the second bank of amplifiers A1–A6 are all of similar construction, the signals at the respective output terminals are substantially in phase and are added by the combiner 23 to provide substantially the maximum power obtainable from these signals at the output terminal 23a.

Though the solid state high power microwave amplifier has been described with a 1:6 power divider, six first stage amplifiers, a 1:5 power divider and five component amplifiers in each of the second stage amplifiers, a 5:1 power combiner in each of the second stage amplifiers, and a 6:1 power combiner for combining the output signals of the second stage amplifiers, it should be recognized that these are not limitations and that a high power amplifier my be constructed with 1:N and 1:M power dividers in the first and second stages, respectively, N first stage amplifiers, M component amplifiers, and M:1 and N:1 power combiners.

Figure 2:
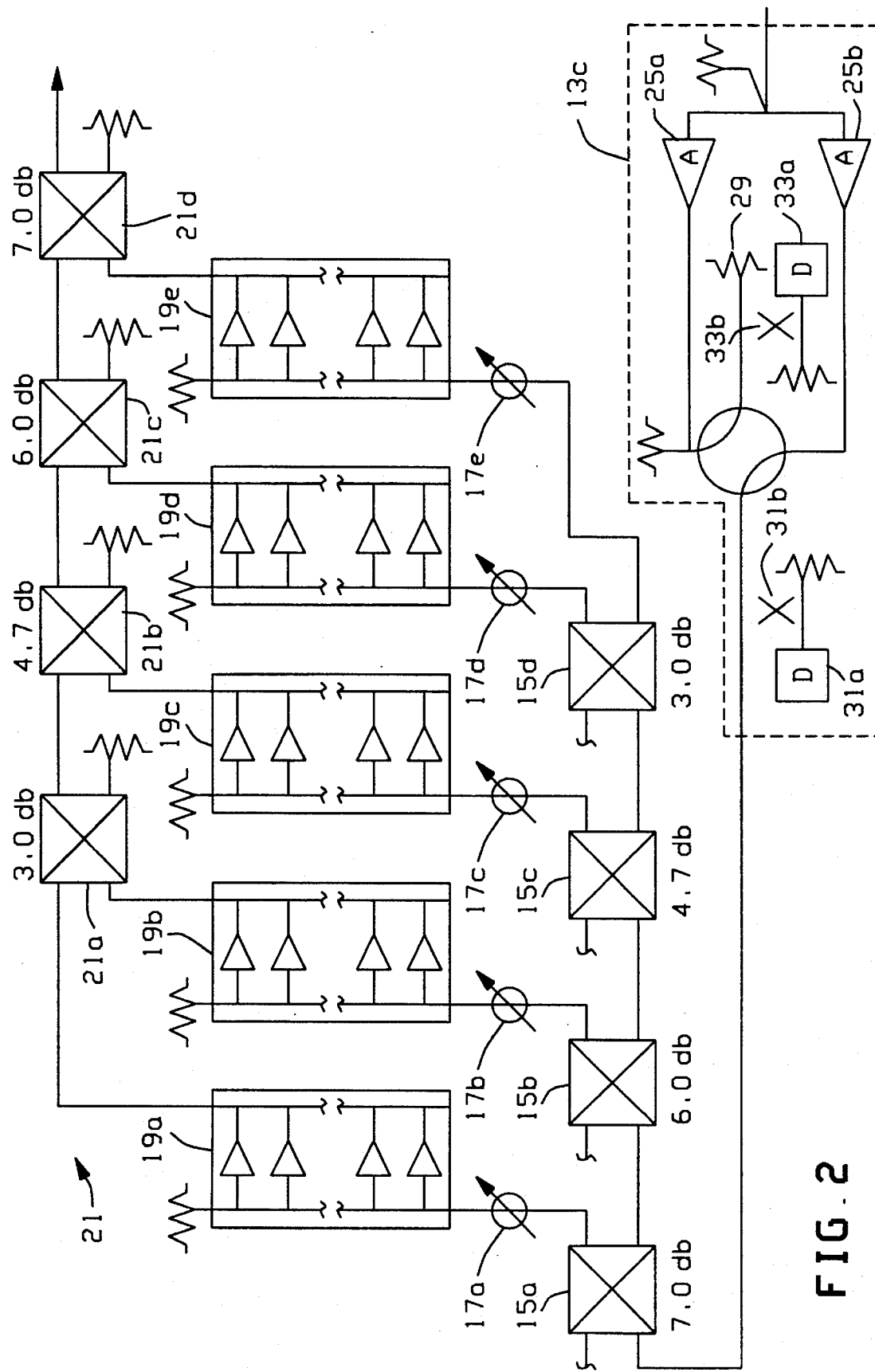
FIG. 2 is a block diagram of a second stage amplifier which may be utilized in the microwave amplifier of FIG. 1.

Refer now to FIG. 2, wherein a more detailed representation of the first stage amplifier 13c and second stage amplifier A3 combination, which is representative of all the first and second stage amplifier combinations, is shown. In FIG. 2, as in all subsequent figures, previously referenced elements bear the reference numeral assigned at the initial reference. First stage amplifier 13c may include two similarly constructed amplifiers 25a and 25b having input terminals coupled in phase to an output terminal of power divider 11 and output terminals coupled to a switch 27. Initially switch 27 may couple one of the amplifiers 25a, 25b to the second stage divider 15 and the other to a dummy load 29. As shown in the figure, amplifier 25b is coupled to the divider 15. The output signal of amplifier 25b is monitored by a detector 31a via a directional coupler 31b. If detector 31a detects a failure of amplifier 25b, the switch 27 is activated to couple amplifier 25a to the divider 15 so that the operation of the system my continue without interruption while amplifier 25b is replaced. System operation continues thereafter with the amplifier 25a replacement until a fault in this amplifier is detected. To insure that a properly operating amplifier is substituted for one that has failed, the stand-by amplifier may be maintained in the operating mode and its output signal monitored by via second directional coupler 33b by a second detector 33a. Should a failure of the stand-by amplifier be detected, it my be replaced while the system is operating so that a properly functioning amplifier is always at stand-by.

The signal output of amplifier 13c is coupled to an input terminal of a first of four serially coupled directional couplers which comprise power divider 15. The first coupler 15a is a 7.0 dB coupler which couples 1/5 of the signal power at its input terminal to the first component amplifier 19a, via phase shifter 17a, and 4/5 of the signal power to the input terminal of the second directional coupler 15b. Thus, should a signal having 5 watts of power be coupled to directional coupler 15a, 1 watt will be directed to amplifier 19a and 4 watts will be directed to directional coupler 15b. Directional coupler 15b is a 6 dB coupler which couples 1/4 of the signal power at its input terminal to component amplifier 19b, via phase shifter 17b, and 3/4 of this signal power to the input terminal of directional coupler 15c. Thus, the 5 watts coupled to the input terminal of the power divider 15 is divided to provide 1 watt to the amplifiers 19a and 19b and 3 watts to the input terminal of the next directional coupler 15c. Directional coupler 15c is a 4.7 dB coupler which couples 1/3 of the power at its input terminal to amplifier 19c, via phase shifter 17c, and 2/3 of this signal power to directional coupler 15d. Thus, after traversing the three directional couplers 15a, 15b, and 15c, 5 watts of power at the input terminal of the power divider 15, is divided to couple 1 watt to each of the amplifiers 19a, 19b, and 19c, and 2 watts to the last directional coupler 15d. Directional coupler 15d is a 3 dB directional coupler which directs the 2 watts of signal power coupled to its input terminal equally to amplifiers 19d and 19e, via phase shifters 17d and 17e respectively. It should now be apparent that 5 watts of power coupled to the input terminal of the power divider 15 is equally distributed between the amplifiers 19a–19e, to provide 1 watt of power at the input terminal of each of these amplifiers.

Each of the amplifiers 15a–15b may provide approximately 26 dB of amplification. Therefore, after amplifying the 1 watt signal coupled from the divider 15 each of the amplifiers 15a–15b respectively couple approximately 400 watts of signal power to the second stage power combiner 21. The power combiner 21 may be comprised of four directional couplers 21a–21d having the same coupling factors as the directional couplers in the power divider 15. The directional couplers in the combiner 21, however, are arranged to be in an order that is the reverse of the directional coupler order in the divider 15. It should be recognized that the signal at the output terminal of a directional coupler is the vector addition of the voltages at the input terminal, the voltage at the output terminal of 3 dB directional coupler 21a, having its input terminals coupled to the output terminals of the amplifiers 19a and 19b, is $\sqrt{2}$ V, where V is the normalized voltage at each of the input terminals of the directional coupler 21a. Therefore, the power at the output terminal of directional coupler 21a is 2

$V^2$. Since, $V=A (P/5)^{1/2}$, where $A^2$ is the power amplification of the amplifiers and P is the power at the input terminal of the power divider 15, which was assumed to be 5 watts, the power at the output terminals of the 3 dB directional coupler 21a is 2 $A^2$ watts, which is about 900 watts when $A^2$ is between 26 dB and 27 dB. Those skilled in the art will ascertain that the power at the output terminals of directional couplers 21b, 21c, and 21d are about 1350 watts, 1800 watts, and 2250 watts, respectively.

Figure 3:
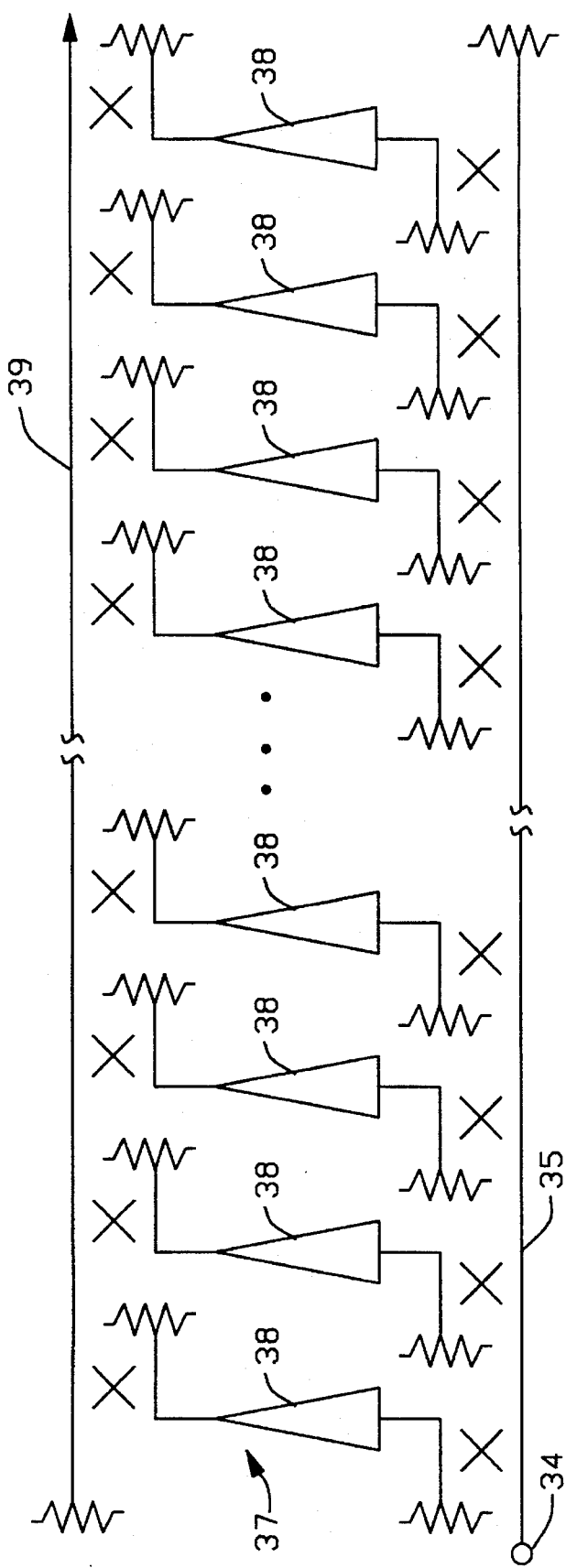
FIG. 3 is a schematic diagram of an amplifier which may be utilized as a component of the second stage amplifier.

Refer now to FIG. 3 wherein a schematic diagram that is representative of a component amplifier in the component amplifier bank 19 is shown. A signal from the power divider 15 is coupled to an input terminal 34 of a power distribution unit 35, which my be a waveguide, for distribution to bank 37 of lower power amplifiers 38, which may total forty-seven. Varying coupling ratios are provided between the distribution unit and the low power amplifiers 38 to provide equal power to all of the low power amplifiers in a manner similar to that previously described. After amplification, the output signals of the low power amplifiers 38 are coupled to a power output unit 39, which my also be a waveguide, with coupling ratios which are the same as those utilized to couple the low power amplifiers 38 to the power distribution unit 35, but arranged in reverse order.

Each of the low power amplifiers 38, in the low power amplifier bank 37, receive a signal having a power level in the order of 20 milli-watts and has a gain that is between 26 dB and 27 dB. Thus, each low power amplifier couples a signal to the output unit 39 which is at a power level in the order of 10 watts.

Figure 4:
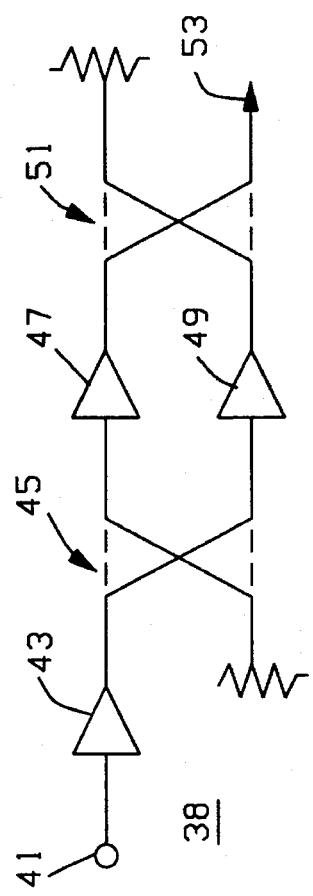
FIG. 4 is a schematic diagram of a sub-component amplifier which may be utilized in the component amplifier of FIG. 3

Each low power amplifier 38 may be a monolithic microwave integrated circuit (MMIC) module with two stages of amplification, as shown in FIG. 4. A signal from the input distribution unit 35 is coupled to an input terminal 41 of the first stage amplifier 43 which may be in the order of 0.02 watts (13 dBm). Amplifier 43 my provide 14c dB of amplification, thereby coupling a signal with a power level in the order of 0.05 watts (27 dBm) to the input terminal of a 3 dB directional coupler 45, which in turn provides signals at power levels in the order of 0.25 watts to amplifiers 47 and 49. Each amplifier 47 and 49 provides 13 dB of amplification, thus establishing a signal at a power level in the order of 5 watts (37 dBm) at the output terminals of each amplifier. These output terminals are coupled to the input terminals of a second 3 dB directional coupler 51 wherein the signals are added to furnish a signal at a power level in the order of 10 watts at the output terminal 53.

The first stage amplifiers and the MMIC modules in each of the second stage amplifiers may comprise field effect transistors (FET). These devices require DC voltages for the gate and drain biases, as for example −5 volts bias for the gate and +9 volts bias for the drain. Utilization of a central power supply to provide these bias voltages subjects the system to catastrophic failure should the central power supply fail in any respect. To avoid such catastrophic failure the modular design of the high power amplifier system is maintained by providing dedicated power supplies for each combination of first and second stage amplifiers, that is, dedicated power supplies are respectively provided for the first and second stage amplifier combinations 13a and A1, 13b and A2, 13c and A3, etc.. This power supply arrangement provides a fail soft mechanism for higher reliability. Should one module of the power supply fail, only amplifiers coupled thereto would cease operation and replacement could be performed while the system remains in operation. Diagrams of the bias supply for modules of the power supply are shown in FIG. 5, which is a block diagram of the +9 volts drain bias supplies, and in FIG. 6, which is a block diagram of the −5 volts gate bias supply.

Figure 5:
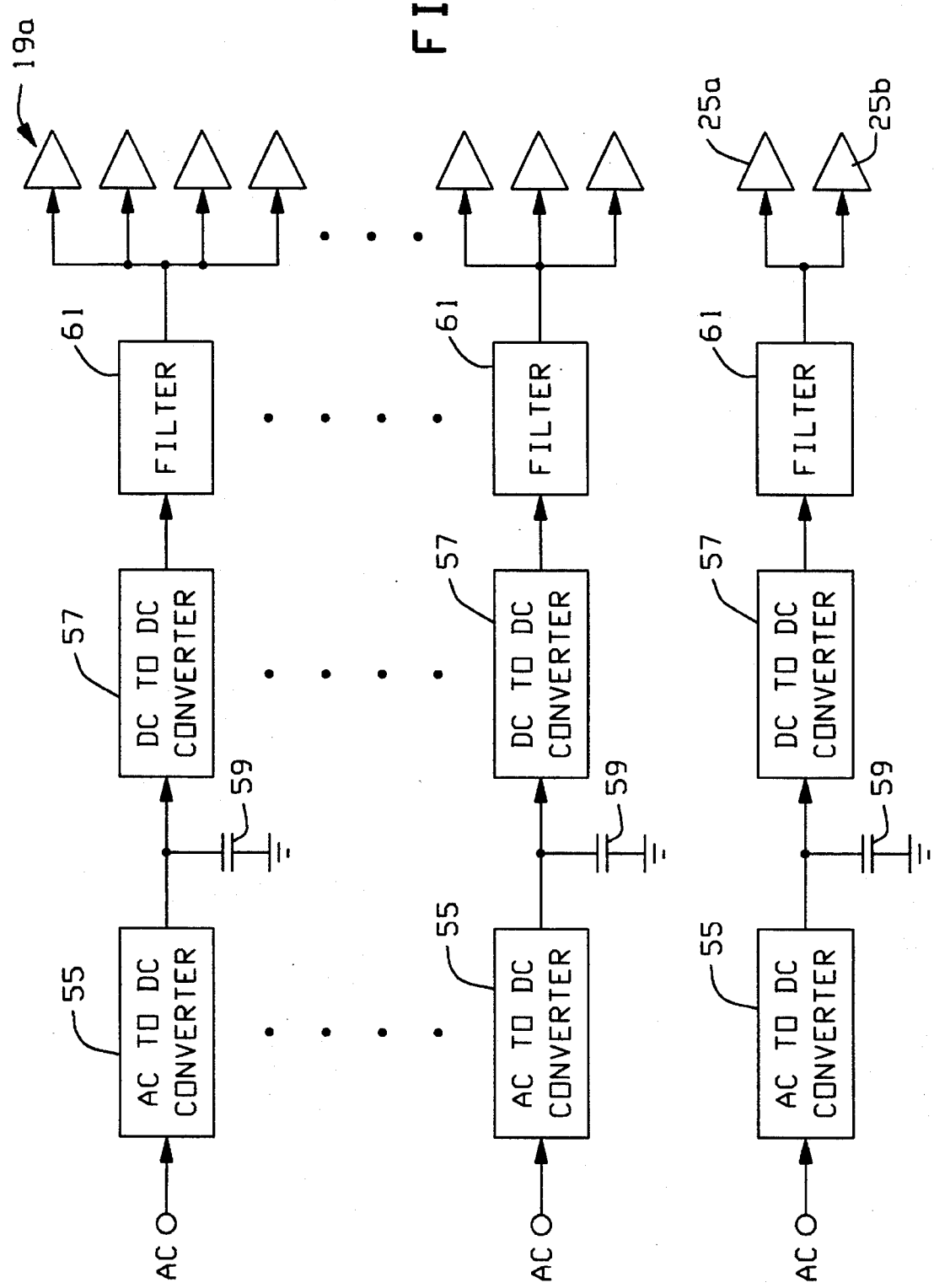
FIG. 5 is a block diagram of a distributed power supply.

Refer now to FIG. 5. Power supply modules for the MMIC modules in a component amplifier, as for example component amplifier 19a, may comprise a plurality of power supply blocks, each including an AC to DC converter 55, which converts an AC voltage source to a DC voltage. This AC to DC converter is coupled to DC to DC converter 57, which reduces the DC voltage at the output terminal of the converter 55 to the desired +9 volt bias level. A capacitor 61 is shunt coupled to the junction of the converters 55 and 57 to provide initial filtering of the ripple on the DC voltage. A filter 61 is coupled to the DC to DC converter for additional filtering. Each power supply block may be coupled to a plurality MMIC modules. Since the MMIC modules in the component amplifiers may total 47 one module power supply coupling arrangement my include eleven groups of four MMIC modules and one group of three MMIC modules, each group respectively coupled to a power block. It should be recognized that any number of MMIC modules may be coupled to a power supply block and that the above described arrangement my be varied to suite the system.

A separate 9 volts module of the power supply is provided for the first stage amplifier associated with each of the second stage amplifiers, as shown in FIG. 5 for the redundant first stage amplifiers 25a and 25b.

Figure 6:
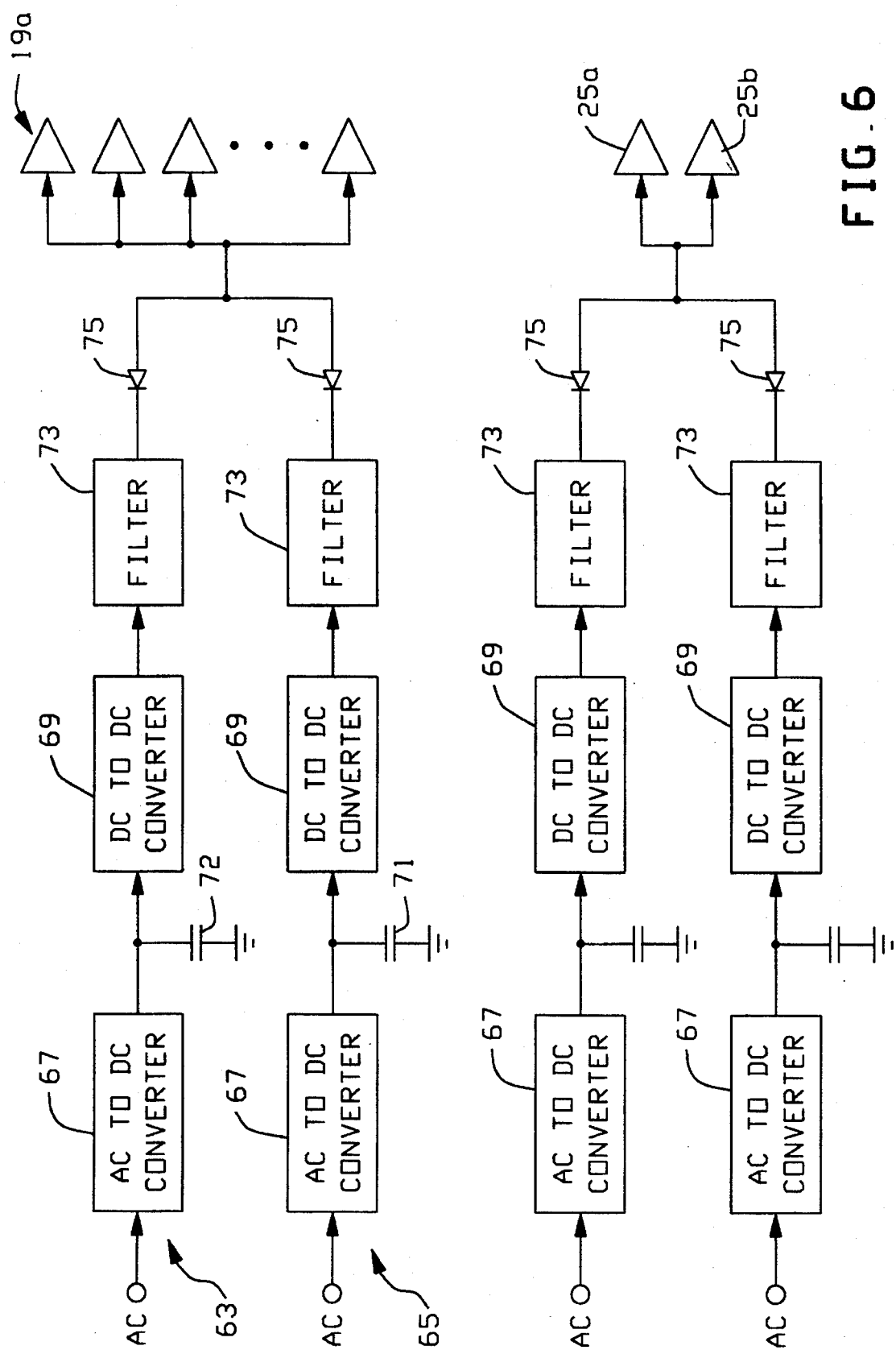
FIG. 6 is a block diagram of a redundant power supply.

Since the gate of a FET draws little current, the probability of failure of it bias supply is extremely low. Consequently, one bias supply block generally provides sufficient reliability. To insure continuous operation should a failure occur in the power supply, a redundant bias supply my be provided, as shown in Figure 6. Two identical power supply blocks 63 and 65 may be arranged in parallel, each comprising an AC to DC converter 67 coupled to a DC to DC converter 69. A shunt capacitor 71 may be coupled to the junction of the converters for reducing ripple voltage. The DC voltage from the DC to DC converter 69 is coupled to a filter 73 for additional ripple voltage reduction. Unidirectional current devices, which my be diodes, are coupled between the filters 73 and the gates of the MMIC modules in the component amplifier 19a to prevent coupling of a positive polarity voltage to FET gates in the MMIC modules.

A separate redundant −5 volts module of the power supply is provided for the first stage amplifier associated with each of the second stage amplifiers, as shown in FIG. 6 for the redundant first stage amplifiers 25a and 25b.

Figure 7:
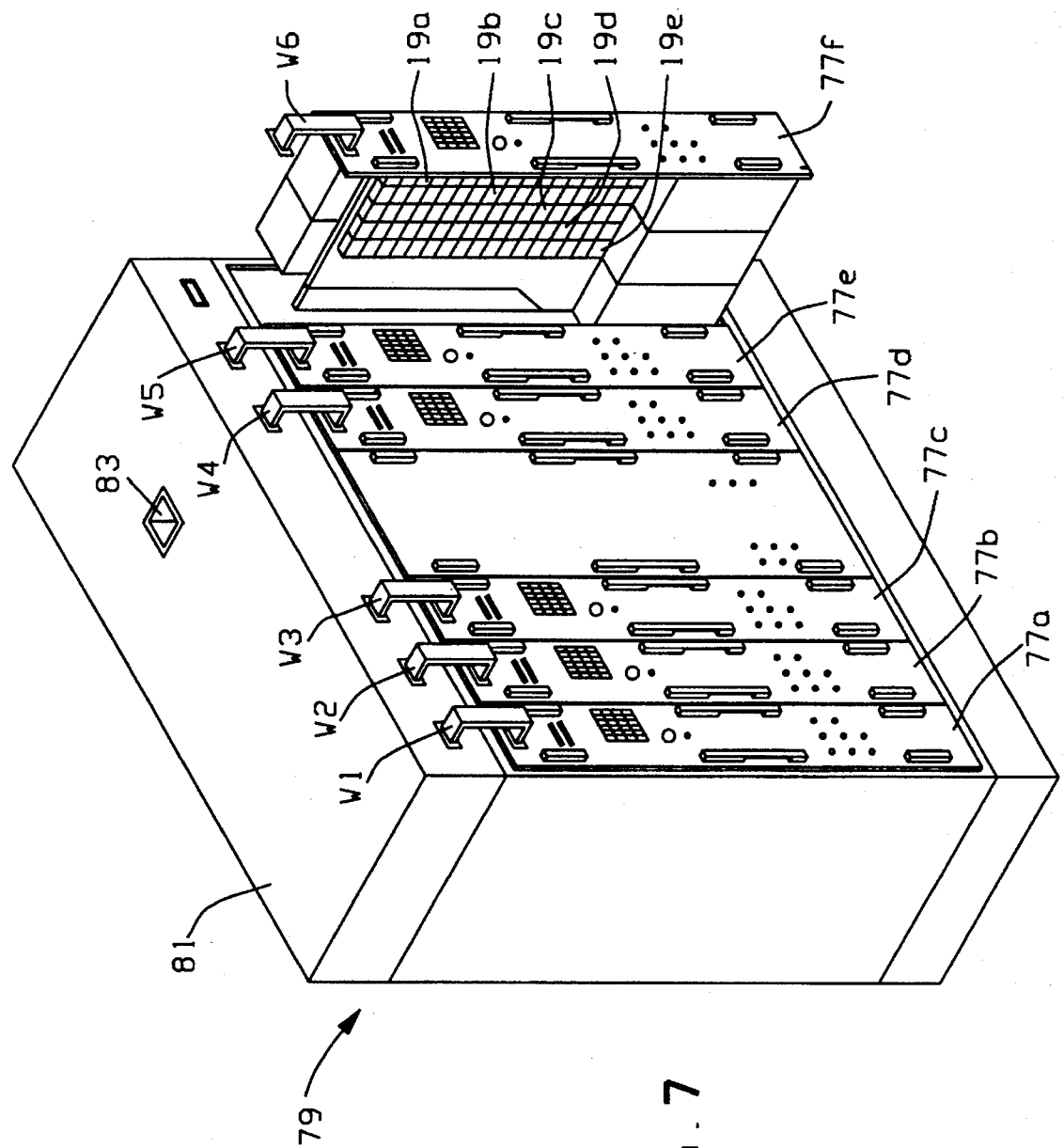
FIG. 7 is an illustration of a mechanical assembly of the amplifier of FIG. 1.

The modular design described above permits each combination of first stage 13a–13f and second stage A1–A6 amplifiers to respectively occupy drawers 77a–77f in a cabinet 79 housing the complete amplifier, as shown in FIG. 7. Each drawer my contain the five component amplifiers 19a–19b of a second stage amplifier and the modular power supply blocks for that amplifier. Signals at the output terminals of the amplifiers are coupled via waveguides W1–W6 to the combiner 23 of FIG. 1 which is housed in an upper panel 81 of the cabinet 79. The combined signals are coupled to a wave guide output terminal 83, which is the output terminal 23a in the block diagram of FIG. 1.

Figure 8A:
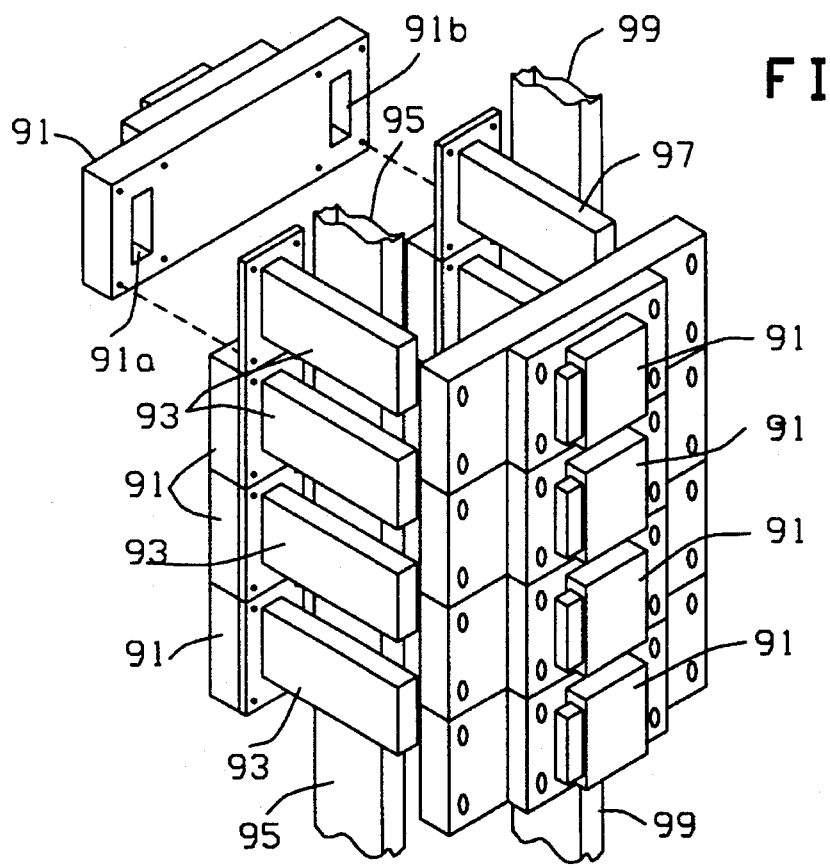
FIG. 8A is an expansion of a portion of FIG. 7.
Figure 8B:
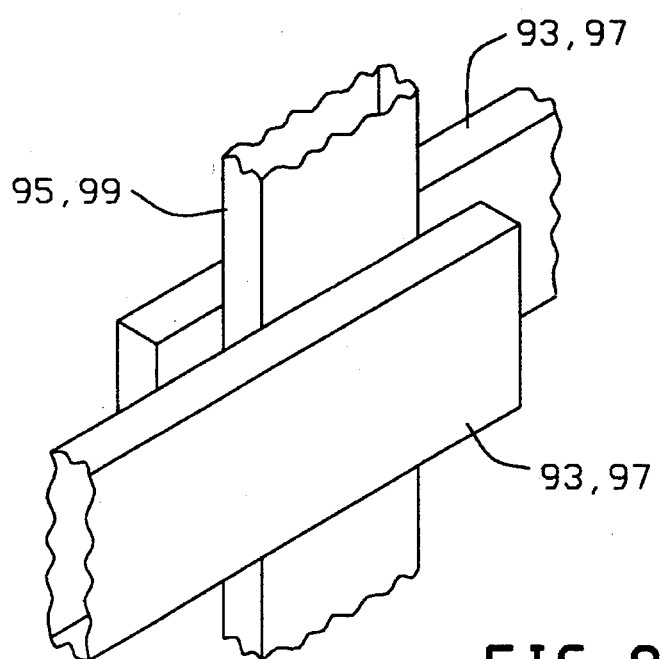
FIG. 8B is an expansion of a portion of FIG. 8A.

Each of the component amplifiers 19a–19b my be arranged as shown in FIGS. 8A and 8B. Amplifier modules 91, yet to be described, include the MMIC amplifiers and have an input waveguide terminal 91a and an output waveguide terminal 91b. The input terminals 91a are respectively coupled to terminated waveguides 93, which in tern are broad wall coupled to an input waveguide 95, which corresponds to the power distribution unit of FIG. 3. The output signals from the amplifier modules 91 are coupled via the output terminals 91b to terminated waveguides 97, broad wall coupled to an output waveguide 99, corresponding to the power output unit 39 of FIG. 3. To minimize the length of the input and output waveguides, the broad wall couplings are on the top and bottom walls of the input and output waveguides as shown in FIG. 8B, which is representative of the terminated waveguide couplings to both the input and output waveguides. The couplings of the terminated waveguides to the input and output waveguides are constructed to establish directional couplers having the varying coupling values described for the MMIC arrangement of FIG. 3.

Figure 9:
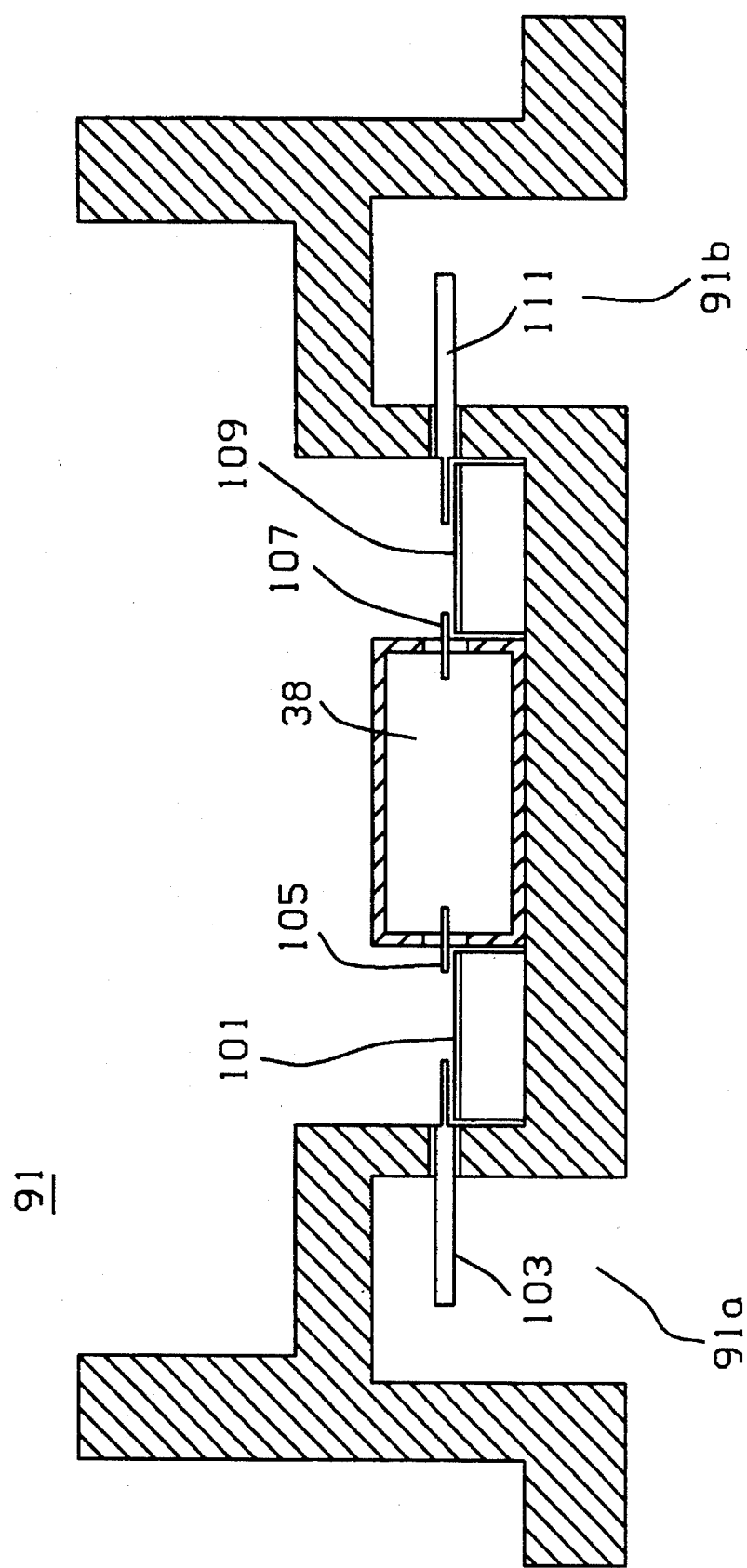
FIG. 9 is a cross-sectional view of monolithic microwave integrated amplifier circuit and waveguide assembly.

Refer now to FIG. 9 wherein a cross-sectional view of the amplifier module 91 is shown. The input terminal 91a of the amplifier module is coupled to a microstrip transmission line 101 via a waveguide-to-microstrip transition 103. The microstrip transmission line 101 is then coupled to the MMIC low power amplifier 38 via a probe 105. The output of the low power amplifier 38 is coupled via a probe 107 to second microstrip transmission line 109 and therefrom, via a second waveguide-to-microstrip transition 111, to the output terminal 91b of the amplifier module 91.

We claim:

1. An apparatus comprising:

means for receiving an input signal;

a power divider having an input terminal coupled to receive said input signal and having a plurality of output terminals at which said input signal is equally divided;

a plurality of amplifiers, said amplifier plurality being equal to said plurality of said power divider output terminals, said amplifiers respectively coupled to said power divider output terminals, each amplifier including a first stage amplifier coupled to said power divider and a second stage amplifier coupled to said first stage amplifier, said second stage amplifier including a first multiplicity of first component amplifiers, each first component amplifier including a second multiplicity of second component amplifiers;

a power supply constructed and arranged in power supply modules, said power supply modules including second component amplifier power supply modules having a multiplicity equal to said second multiplicity and respectively coupled to said second component amplifiers to supply DC power thereto; and a combiner having a plurality of input terminals, said plurality of combiner input terminals being equal to said plurality of said output terminals of said power divider, and an output terminal whereat portions of signals at said plurality of input terminals are combined, said input terminals of said combiner respectively coupled to output terminals of said first component amplifiers.

2. An apparatus in accordance with claim 1 wherein each of said first component amplifiers further includes:

a second power divider having an input terminal coupled to an output terminal of said power divider and a multiplicity of output terminals, said multiplicity of output terminals being equal to said second multiplicity, said output terminals respectively coupled to input terminals of said first component amplifiers in a manner to couple signals of equal signal power to said second component amplifier; and a second power combiner having a multiplicity of input terminals, said input terminal multiplicity being equal to said second multiplicity, said input terminals respectively coupled to output terminals of said first component amplifiers.

3. An apparatus in accordance with claim 1 wherein said first stage amplifier includes:

first and second redundant amplifiers each having input terminals coupled to said first power divider and output terminals;

a 2 by 2 commutation switch coupled to said output terminals of said first and second redundant amplifiers, said second power divider, and a dummy load, said switch coupling said first redundant amplifier to said second power divider and second redundant amplifier to said dummy load in a first position and coupling said second redundant amplifier to said second power divider and said first redundant amplifier to said dummy load in a second position.

4. An apparatus in accordance with claim 3 wherein said first stage amplifier further includes:

first signal level detector means coupled between said 2 by 2 commutation switch and said second power divider for monitoring levels of signals coupled to said to said second power divider; and second signal level detector means coupled between said 2 by 2 commutation switch and said dummy load for monitoring levels of signals coupled to said dummy load.

5. An apparatus in accordance with claim 1 wherein said power supply further includes an additional power supply module coupled to said first stage amplifier to supply DC power thereto.

6. An apparatus in accordance with claim 2 wherein; said power divider includes a multiplicity of directional couplers, said directional coupler multiplicity being one less than said second multiplicity, said directional couplers having varying coupling values and coupled to said second stage amplifiers in an order that provides equal power to said second stage amplifiers; and said combiner includes a multiplicity of directional couplers, said directional coupler multiplicity being one less than said second multiplicity, said combiner directional couplers having coupling values respectively equal to said coupling values of said power divider and coupled to said second stage amplifiers in reverse order to that of said directional couplers of said power divider.

7. An apparatus in accordance with claim 6 wherein said second stage amplifiers include:

a distribution unit coupled to a respective directional coupler of said power divider, said distribution unit constructed and arranged to coupled signals with equal power levels to said second component amplifiers; and a power output unit coupled to receive and combine output signals from said second component amplifiers, said power output unit having an output terminal whereat output signals of said second stage amplifiers are provided.

8. An apparatus in accordance with claim 7 wherein:

said distribution unit comprises a multiplicity of directional couplers, said multiplicity being equal to said second multiplicity, said directional couplers having varying coupling values and respectively coupled to said second component amplifiers, said directional couplers arranged to provide said equal power levels to said second component amplifiers; and said output unit comprises a multiplicity of directional couplers, said multiplicity of output unit directional couplers being equal to said second multiplicity, said output unit directional couplers having coupling values equal to said coupling values of said distribution unit, said output unit directional couplers being respectively coupled to output terminals of said second component amplifiers in a manner to arrange said output unit directional coupler coupling values in reverse order to that of said distribution unit directional coupler coupling values.

9. An apparatus in accordance with claim 8 wherein:

said distribution unit directional couplers include a distribution waveguide having an input terminal coupled to an output terminal of said second power divider, and a multiplicity of output waveguides, said multiplicity being equal to said second multiplicity, said output waveguides respectively coupled to said second component amplifiers and cross coupled to said distribution waveguide in a manner to provide said varying coupling values of said distribution unit directional couplers; and said output unit directional couplers include an output waveguide having an output terminal coupled to said second combiner, and a multiplicity of input waveguides, said multiplicity of input waveguides being equal to said second multiplicity, said input waveguides respectively coupled to output terminals of said second component amplifiers and cross coupled to said output waveguide in a manner to provide said varying coupling values of said distribution unit directional couplers in reverse order to that of said distribution unit directional couplers coupling values.

10. An apparatus in accordance with claim 1 wherein each of said second component amplifiers includes a monolithic microwave integrated circuit (MMIC) comprising:

a first MMIC amplifier having an input terminal coupled to said power divider and an output terminal;

a first 3 dB directional coupler having an input terminal coupled to said output terminal of said first MMIC amplifier and first and second output terminals;

a second MMIC amplifier having an input terminal coupled to said first output terminal of said first 3 dB directional coupler and an output terminal;

a third MMIC amplifier having an input terminal coupled to of said second output terminal of said first 3 dB directional coupler and an output; and a second 3 dB directional coupler having a first input terminal coupled to said output terminal of said second MMIC amplifier and a second input terminal coupled to said third MMIC amplifier and an output terminal coupled to said combiner.

11. An apparatus in accordance with claim 1 wherein said second power supply modules include:

first means for providing a first DC voltage to all of said second component amplifiers; and second means respectively coupled to groups of second component amplifiers, each of said groups having a predetermined number of second component amplifiers, for providing a second DC voltage to second component amplifiers in all of said groups.

12. An apparatus in accordance with claim 11 wherein not all of said groups contain an equal number of second component amplifiers.

13. An apparatus in accordance with claim 12 wherein said first means includes first and second, similarly constructed, sub-means both coupled to said second component amplifiers to provide redundant first voltages.

* * * * *